United States Patent
Stern

(12) 
(10) Patent No.: US 10,538,344 B2
(45) Date of Patent: Jan. 21, 2020

(54) POWER MANAGEMENT SYSTEM FOR SPACE PHOTOVOLTAIC ARRAYS

(71) Applicant: SolAero Technologies Corp., Albuquerque, NM (US)

(72) Inventor: Theodore Garry Stern, El Cajon, CA (US)

(73) Assignee: SolAero Technologies Corp., Albuquerque, NM (US)

(*) Notice: Subject to any disclaimer, the term of this patent is extended or adjusted under 35 U.S.C. 154(b) by 128 days.

(21) Appl. No.: 15/707,036

(22) Filed: Sep. 18, 2017

(65) Prior Publication Data

US 2019/0084696 A1 Mar. 21, 2019

(51) Int. Cl.
*B64G 1/44* (2006.01)
*H02S 10/40* (2014.01)
(Continued)

(52) U.S. Cl.
CPC .......... *B64G 1/443* (2013.01); *H01L 31/0504* (2013.01); *H02J 3/385* (2013.01);
(Continued)

(58) Field of Classification Search
CPC ........ B64G 1/443; B64G 1/425; B64G 1/428; H02S 10/40; H02S 20/32; H02S 40/32;
(Continued)

(56) References Cited

U.S. PATENT DOCUMENTS 5,394,075 A * 2/1995 Ahrens ................. B64G 1/428
136/246
5,949,212 A * 9/1999 Cherry ................... H02J 7/355
320/101
(Continued)

FOREIGN PATENT DOCUMENTS

CN 104158471 A 11/2014
CN 104158478 A 11/2014
(Continued)

OTHER PUBLICATIONS

European Search Report for EP Patent Application No. 17199477.5, dated Jun. 12, 2018, 9 pages.
(Continued)

*Primary Examiner* — Carlos Amaya

(57) ABSTRACT

In one aspect, the present disclosure provides a power management system for a space vehicle, the system including: a photovoltaic array including a plurality of panels, wherein each panel includes one or more solar cell strings, each solar cell string including a plurality of photovoltaic cells connected in series to produce direct current (DC) power; at least one regulator module disposed on each of the one or more solar cell strings, the at least one regulator module being configured to condition the DC power produced by the one or more solar cell strings in the panel and supply it through at least one electrical connection line to the electrical power harness to route said power to a root power management unit; and an interface configured to transfer power produced by the photovoltaic array from the root power management unit to the vehicle, the interface having a first end configured to be connectable with the vehicle and a second end configured to be connectable with the photovoltaic array.

16 Claims, 3 Drawing Sheets

(51) Int. Cl.
*H02J 3/38* (2006.01)
*H02S 40/32* (2014.01)
*H02S 40/38* (2014.01)
*H01L 31/05* (2014.01)
*H02J 7/00* (2006.01)

(52) U.S. Cl.
CPC .............. *H02J 7/007* (2013.01); *H02S 10/40* (2014.12); *H02S 40/32* (2014.12); *H02S 40/38* (2014.12)

(58) Field of Classification Search
CPC ....... H02S 40/38; G05F 1/67; H01L 31/0504; H02J 3/385; H02J 7/007; H02J 7/355
USPC .......................................................... 307/9.1
See application file for complete search history.

(56) References Cited

U.S. PATENT DOCUMENTS

| | | |
|---|---|---|
| 6,127,621 A | 10/2000 | Simburger |
| 8,442,697 B2 | 5/2013 | Schmitz et al. |
| 2007/0044837 A1* | 3/2007 | Simburger ............. B64G 1/428 136/244 |
| 2008/0150366 A1* | 6/2008 | Adest ................... H02M 3/1582 307/77 |
| 2009/0158061 A1 | 6/2009 | Schmitz et al. |
| 2011/0073714 A1 | 3/2011 | Hruby et al. |
| 2012/0091810 A1* | 4/2012 | Aiello ..................... H02J 1/102 307/64 |
| 2012/0139352 A1 | 6/2012 | Allen et al. |
| 2012/0161527 A1 | 6/2012 | Casey et al. |
| 2013/0328403 A1 | 12/2013 | Kaufman et al. |
| 2017/0077709 A1 | 3/2017 | Kim et al. |

FOREIGN PATENT DOCUMENTS

| | | |
|---|---|---|
| JP | 2000-085696 A | 3/2000 |
| JP | 2005-167167 A | 6/2005 |

OTHER PUBLICATIONS

Japanese Search Report for JP Patent Application No. 2018-031720, dated Jul. 2, 2018, 3 pages.

* cited by examiner

POWER MANAGEMENT SYSTEM FOR SPACE PHOTOVOLTAIC ARRAYS

FIELD OF THE DISCLOSURE

The present disclosure belongs to the field of power generation and management, specifically to the field of photovoltaics, where photovoltaic arrays (e.g., solar cell arrays) are used to collect and convert incident sunlight into power. The disclosure provides a power management system for managing and conditioning said power. In addition, the present disclosure provides a vehicle including the power management system. In some embodiments, the vehicle is adapted for operation in space (e.g., a satellite) and may rely on the use of photovoltaic arrays to produce power from sunlight.

BACKGROUND

Conventional photovoltaic arrays may be deployed on a flexible or rigid panel or sheet. In some embodiments, the deployed photovoltaic array is substantially planar. Individual solar cells, frequently with a rectangular or generally square-shape and sometimes with cropped corners, are connected in electrical series to form a string of solar cells, in which the number of solar cells used in the string determines the output voltage. Individual solar cells, or strings of solar cells, can also be interconnected in parallel, so as to increase the output current of the array. The individual solar cells are provided with electrical interconnects that facilitate the series or parallel connection of cells to form an array. The solar cells are configured to collect the energy or power of the solar radiation and output the energy as electricity in direct current (DC) form. The solar radiation received may be both from the incident light coming directly from the sun and from the diffused light resulting from intermediate reflections.

The overall performance of the photovoltaic arrays relies on the electrical requirements (current-voltage, i.e. I-V), namely: current that varies with total cell area, level of incident solar intensity, the panel photon-current conversion characteristics that degrade over time; and voltage that varies with the number of cells in series, the operating temperature, and the photon-current panel conversion characteristics that degrade over time.

For vehicles operating in space, acceptable performance often appears achievable at Beginning-of-Life (BOL), even for designs providing enhanced shielding to the solar cell for higher benefits at End-of-Life (EOL). But missions go through a variety of complex environments, including the vastly different illumination and temperatures seen during normal earth orbiting missions, as well as for deep space missions, operating at different distances from the sun, such as at 0.7, 1.0, and 3.0 AU (AU meaning astronomical units). The photovoltaic arrays must also endure anomalous events from space environmental conditions, and unforeseen environmental interactions during exploration missions. Hence, radiation exposure, collisions with space debris, and/or normal aging in the photovoltaic array and other systems could cause suboptimal operating conditions that degrade the overall power system performance, and may result in failures of one or more solar cell arrays that, in an uncontrolled array of high voltage solar cell strings, may cascade to other arrays of solar cells.

The power produced by the photovoltaic array depends on the incident light intensity, and is transmitted by power distribution lines at a voltage that is a compromise between: the maximum voltage at which the solar cell array can safely operate, and higher voltages desired for efficient transmission.

Vehicles need photovoltaic arrays to deliver high voltage power for supplying high power generation systems: in order to minimize the mass of the power distribution lines or electrical power harness, and for applications that need 300V or greater, such as direct drive solar electric propulsion (SEP), for directly driving the SEP power processing unit.

Solar cell strings face challenges achieving high voltage: a high numbers of solar cells in series with each string complicates cell layout; environmental interactions especially with respect to electrostatic discharge (ESD) happen as voltage exceeds 33V; and high voltages exacerbate untoward interactions with the natural space plasma environment in earth orbit.

The aforementioned low efficiency in transmission at low voltage is because the major penalty of high current is resistive losses. Hence, power loss and the resulting loss of efficiency increases very rapidly with current (being proportional to current squared times resistance); and therefore, the efficiency is enhanced by lowering current and increasing the voltage as much as possible until approaching voltage breakdown of materials.

State-of-art photovoltaic arrays are typically passive electronics, i.e. they have no power management and control on the array associated with a single panel. Without voltage changing capability on the photovoltaic array, solar cell strings need to deliver their power at a voltage that can be safely operated, which then imposes a low voltage requirement on the solar array's power collection harness. The solar cell string voltages are further limited because of even higher voltages in other operating environments and phases of the mission. For vehicles operating in space, worst case conditions may include the highest temperatures seen in a particular part of each orbit or phase of the mission and/or degradation conditions associated with harsh space environments. The voltages can be very high on the same mission, lowest temperatures for which solar cells have possibly undesirable increased voltage, for example, during a phase of the mission that has a cold environment at 3 AU or during a part of the orbit that is post-eclipse. Designing and operating these solar cell strings at high voltage increases the interactions of the strings with space plasma environment.

Thus, the voltage and current characteristics of the delivered power are normally conditioned and regulated to that needed by the loads in a decentralized manner inside the vehicle, for example, using either a power management unit that is located inside the vehicle architecture as a unique and common point connected by a power bus lines with the loads, or located within the load itself.

By providing a single, unique, and common point to condition and regulate the power delivered to the loads, the overall performance of the system is fixed and unchanged. Moreover, the photovoltaic array may be sized to match within a narrow operational window of electrical current requirements; having therefore no option to change the performance of the system for adaption to the operational environment. Also, the power is transferred through the interface without being regulated, which can result in suboptimal design and operational conditions for the interface components.

Additionally, if this centralized power management unit unexpectedly fails, there is no intermediate point to assume its function, and therefore, the voltage of the power produced is directly transmitted to all the loads and may result in a malfunctioning of the system.

SUMMARY OF THE DISCLOSURE

Objects of the Disclosure

It is an object of the disclosure to provide an improved power management system for a space photovoltaic power system.

It is another object of the disclosure to provide a system in which the power produced and then transmitted into the payload of the space vehicle at the determined voltage, is used for supplying the loads, e.g. charging batteries or supplying power to operating equipment; and therefore requires and benefits from power management prior to delivery to the loads.

It is another object of the disclosure to provide a system positioned in the vehicle to manage wide variations in array voltage and current characteristics over operational life of the vehicle.

Features of the Disclosure

The present disclosure provides a solution for at least some of the aforementioned problems, by use of a power management system for a space vehicle including distributed power management controllers, wherein each controller is associated with either a solar cell string, a solar cell module, or a solar cell panel, platform, or array.

In one aspect, the present disclosure provides a power management system for a space vehicle, the system including: a photovoltaic array including a plurality of panels, wherein each panel includes one or more solar cell strings, each solar cell string including a plurality of photovoltaic cells connected in series to produce direct current (DC) power; at least one regulator module disposed on each of the one or more solar cell strings, the at least one regulator module being configured to condition the DC power produced by the one or more solar cell strings in the panel and supply it through at least one electrical connection line to the electrical power harness to route said power to a root power management unit; and an interface configured to transfer power produced by the photovoltaic array from the root power management unit to the vehicle, the interface having a first end configured to be connectable with the vehicle and a second end configured to be connectable with the photovoltaic array.

In some embodiments, the root power management unit is connected to the second end of the interface by at least one electrical power harness, the root power management unit being configured to convert the DC power produced by the photovoltaic array in the form of DC electrical power from the electrical power harness into high frequency alternating current (AC) power (e.g., 1-20 kHz) or DC power at a different voltage, and to transfer the high frequency AC power or the DC power at the different voltage to the interface through the second end.

In some embodiments, at least one electrical connection line connects at least one regulator module directly to an orientation and power transfer device without root power management, wherein the orientation and power transfer device includes slip rings that transmit DC power through a rotatory joint.

The common configuration of a photovoltaic array is usually a linked set of panels, wherein each panel is divided into sections, with each section including one or more solar cell strings. Said strings are each composed of series connected solar cells to achieve the desired string voltage. In some embodiments, each solar module or panel encapsulates the solar cells for preventing them from being exposed directly to the external conditions.

In some embodiments, the solar cells on the panel can be interconnected by connecting their contacts to form a string or an electrical series and/or parallel connection by suitably interconnecting the terminal pads on the paths of the panel.

In the sense of this disclosure, a vehicle should be understood as any mobile machine that is able to transport either people, payload, or cargo and to power its systems and subsystems by the energy produced from at least a photovoltaic array. By this way, the photovoltaic array is placed aside the vehicle, but being connected to it, wherein such connection may be electrical and/or mechanical. The intermediate part between the photovoltaic array and the vehicle is the so-called interface between both elements. This interface should be understood as the connection point between said elements, either the contact surface per se or an additional intermediate element joining both elements, allowing said electrical and/or mechanical connection. The interface includes a first end configured to be connectable with the vehicle and a second end configured to be connectable with the photovoltaic array.

As the interface is disposed between the vehicle and the photovoltaic solar array, the interface is able to transfer the power produced by the photovoltaic array to the vehicle. Therefore, the photovoltaic solar array outputs the power collected by the energy distribution lines and then the power crosses the interface from the second end to the first end for being injected into the vehicle by power bus lines to supply its systems and subsystems, i.e. the so-called bus subsystems and payloads. In addition to the ability to transfer power, the interface provides a structural and mechanical connection between the photovoltaic solar array and the vehicle. In the case where the photovoltaic array needs to point to the sun independent of the vehicle orientation, the interface also includes orientation devices that rotate or tilt the array at the interface.

In the event said vehicle is configured for operation in space, the vehicle may be any mobile machine intentionally placed into orbit with any purpose, e.g. a space vehicle, a spacecraft or a satellite, for example. Thus, if the vehicle operates in space, the power produced by the photovoltaic array may be used for charging the energy storage battery, supplying the sensors, activating heating, cooling, and telemetry, and for powering vehicle propulsion, for example.

Throughout this disclosure, it will be understood that each regulator module is configured to condition the power provided to one power distribution line, being said power distribution lines electrically separated from each other. Each panel is a discrete structural component, separated from each other, and the regulator module is arranged or disposed thereon. By "conditioning the collected power", it should be understood that the regulator module is configured to monitor, regulate, collect, and transfer the power associated with one or more solar cell strings to provide that power to that individual power distribution line.

As each regulator module conditions the power provided to one power distribution line, each power distribution line includes its own regulator module, allowing: an active voltage regulation on the power distribution line; "maximum power point tracking" (MPPT) for the photovoltaic array panels; regulating over a wide voltage range; low profile for tight on-array packaging for folding or rolling the photovoltaic array; and low mass, less than 50 g per kW produced, or more than 20,000 Watts per kg, even incorporating the shielding.

In some embodiments, the regulator modules can be packaged tightly within a rolled-up or folded photovoltaic array and deployed without impacting the structural photovoltaic array performance characteristics.

In addition, the regulator module can be configured to extract maximum collected power from each solar cell string and provide it to the power distribution line, and can be configured to output the voltage and current optimized for power distribution line operation providing a "maximum power point tracking" (MPPT) function. In other words, MPPT performs impedance or resistance matching to most efficiently collect or harvest power from the solar cell strings and provide that power in the form optimized for power distribution line.

As discussed herein above, the efficiency of power transfer from the solar cells to the power distribution line depends on both the amount of sunlight incident on the photovoltaic array and its electrical characteristics (I-V). Thus, the regulator module matches the impedance or resistance to be presented to the cells to get the most usable power out, in terms of voltage, current or frequency.

Advantageously, the present architecture of the power management system including distributed regulator modules, and in some embodiments in combination with a root power management unit, synergistically allows feeding simpler charge control and power distribution units in the vehicle. Additionally, this configuration can maximize robustness, responsiveness, resiliency, and power harvested from the photovoltaic array, while at the same time reducing the total system mass.

Furthermore, the power management system as disclosed herein includes an optimized power system architecture that handles the power levels and complexity of the load profile, while achieving the highest figures of merit, i.e. low mass, low volume, low cost, and reconfigurability.

Also, the DC power produced by the plurality of photovoltaic cells can then be delivered, in an optimized form, for powering loads contained in the vehicle.

In some embodiments, the system further includes a root power management unit. The root power management unit can include the functions of, among others: converting the power from the regulator module(s) into an electric form suitable for crossing the interface; and converting DC power to high-frequency AC power for transmission through the interface.

In the context of the present disclosure high-frequency AC is understood as meaning power transfer at frequencies between 1 kHz and 50 kHz.

Also, by positioning the root power management unit near the interface, the electronics can be more conveniently and efficiently shielded to endure operational conditions.

In one embodiment, the at least one power distribution line connecting the at least one regulator module to the root power management unit are joined altogether in an array harness.

In this embodiment, each regulator module conditions the collected energy for optimizing the array harness operation. Advantageously, the array harness is optimized for high voltage operation. The array harness may be either a plurality of electrically independent power distribution lines, or a common electrical connection of all power distribution lines. The connection point takes place between the regulator module of each power distribution line, and the root power management unit.

Advantageously, this architecture provides for all the power distribution lines crossing the interface at a common point, thereby increasing operational safety.

In some embodiments, the array harness is a lightweight high-frequency AC harness using skin effect for efficient transmission of the power collected.

In one embodiment, the photovoltaic array includes a plurality of array sections and each array section includes at least one panel, each array section being discrete and separated from each other.

In one embodiment, the photovoltaic array includes a plurality of array sections and each array section includes a plurality of panels, and wherein the panels are connected by a plurality of power distribution lines being parallel distributed inside each of the array sections, and each power distribution line is connected to one regulator module.

In one embodiment, each regulator module can be configured to regulate the power on each power distribution line for providing between 300 and 1000 volts DC on the array harness. In this embodiment, the array harness is a common electrical connection of all power distribution lines. Advantageously, the common electrical connection of all power distribution lines enables meeting the typical electrical requirements in a worst case condition.

In some embodiments, each regulator module has the ability to up-convert from 30 volts DC array peak power to 300 volts DC at high efficiency (>95%).

In one embodiment, the root power management unit is an AC electrical power generator including resonance tanks, said resonance tanks being adapted to convert the DC electrical power into high frequency AC electrical power. Advantageously, this configuration presents low mass and high efficiency.

In one embodiment, the interface includes an orientation driving device for orienting the photovoltaic array.

The orientation driving device should be understood to be similar to a solar tracker. Advantageously, the orientation driving device can provide for minimizing the angle of incidence between the incoming sunlight and a photovoltaic array, thereby increasing the amount of energy produced from the photovoltaic array. As used herein, minimizing the angle of incidence means that the radiant sunlight is substantially perpendicular to the photovoltaic array surface.

In one embodiment, the regulator module and/or the root power management unit is provided with an integrated computer configured for controlling and switching functions and commands Advantageously, the integrated computer can provide for smart control of the functions, and provides for reconfiguration of string or power distribution lines for adaptive power generation, or in situ repair by removal of electrically faulted sections. Moreover, the integrated computer can provide for improved adaptation of voltage, current, and/or frequency of the produce power for widely varying mission conditions of the vehicle.

In one embodiment, the regulator module and/or the root power management unit further includes protective circuitry, such as transient surge suppression, fuses, and/or circuit breakers. Advantageously, the protective circuitry can prevent or at least limit the propagation of faults by disablement of an electrical section.

In one embodiment, the regulator module and/or the root power management unit is provided with sensors for detecting temperature, voltage, and/or current and an integrated computer configured for controlling and switching functions and commands.

In another aspect, this disclosure provides a vehicle including a power management system as described herein. In some embodiments, said vehicle is configured for operation in space.

In one embodiment, the vehicle includes a plurality of loads, and the interface disposed between the vehicle and the photovoltaic array further includes a rotary transformer joint that connects the array harness to a power bus located inside the vehicle, and allows the solar array to rotate and tilt to optimally face the sun independently of vehicle orientation, transfer power across said joint, and wherein said power bus is configured to distribute the power to the plurality of loads of the vehicle by a plurality of power bus lines.

The connection between the array harness and power bus should be understood as an extension or an enlargement in operation of the array harness into the vehicle; i.e. if the array harness is either a plurality of electrically independent power distribution lines, or a common electrical connection of all power distribution lines; the power bus will be alike. Moreover, this connection allows the rotation of the entire photovoltaic array.

In one embodiment, the rotary power transfer is accomplished by a rotary transformer. Advantageously, the rotary transformer joint provides AC power to the vehicle power bus on the first end of the interface in a suitable form.

In one embodiment, one load of the plurality of loads of the vehicle is an energy storage system configured to store energy. This can be advantageous for remote operations of the vehicle or when solar power is not available from the arrays, for example, while the vehicle is in the eclipse portion of an earth orbit.

In one embodiment, the power bus line that distributes the power to the energy storage system from the power bus includes a charging control unit configured to monitor the level of charge of the energy storage system and to rationalize the energy supplied to the said energy storage system. The energy storage system can provide for improved distribution of the collected power among the different loads within the vehicle.

In one embodiment, each power bus line that distributes the energy to the loads includes a power interface unit to control the energy supplied to each load. Advantageously, the power interface unit can allow for drawing AC power from the power bus and converting it into a form most efficient for each load of the vehicle.

In one embodiment, the charging control unit and/or the power interface unit is further provided with protective circuitry such as transient surge suppression, fuses or circuit breakers for preventing and limiting the propagation of faults by disablement of an electrical section.

All the features described in this specification (including the claims, description and drawings) and/or all the steps of the described method can be combined in any combination, with the exception of combinations of such mutually exclusive features and/or steps.

BRIEF DESCRIPTION OF THE DRAWINGS

These and other characteristics and advantages of this disclosure will become clearly understood in view of the detailed description of the disclosure which becomes apparent from a preferred embodiment of the disclosure, given just as an example and not being limited thereto, with reference to the drawings.

DETAILED DESCRIPTION OF EXEMPLARY EMBODIMENTS

Figure 1:
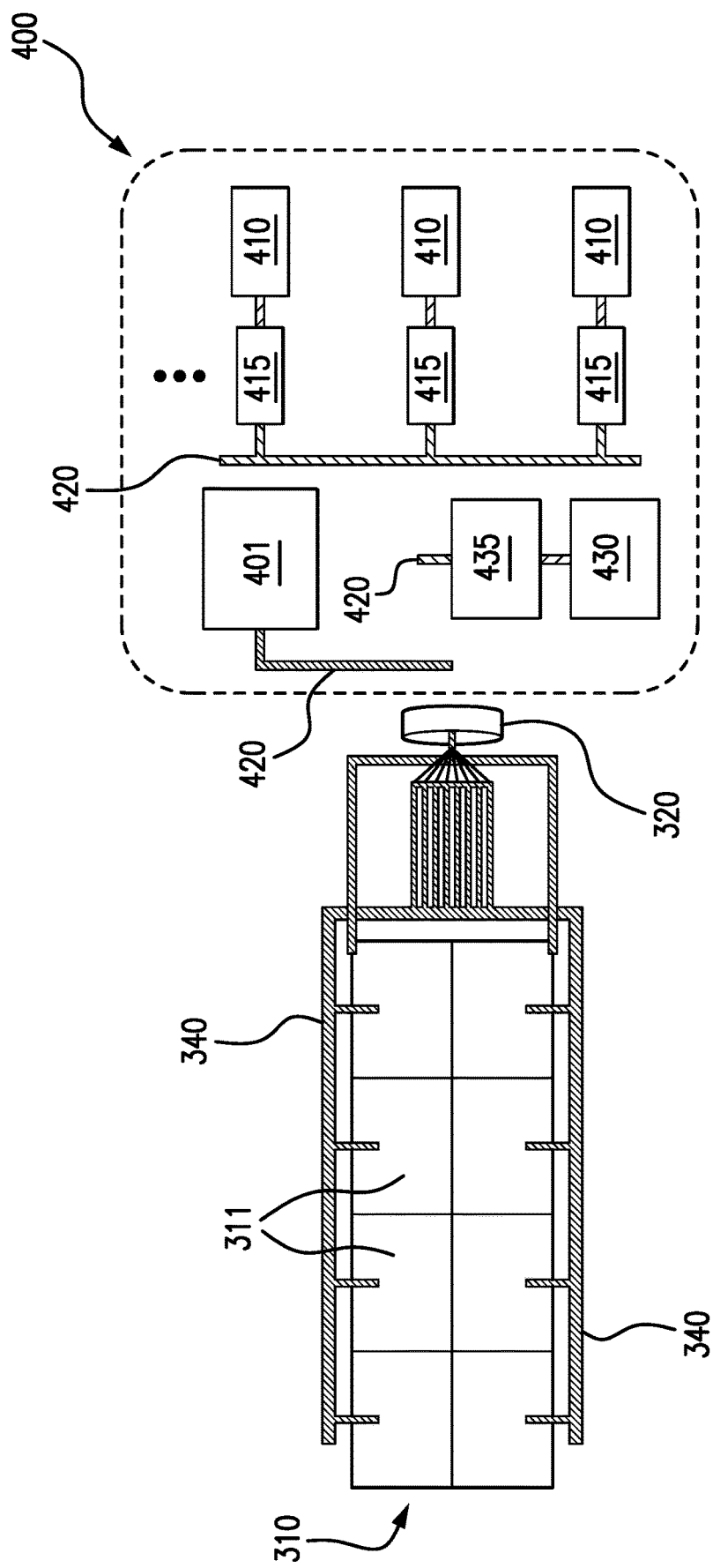
FIG. 1 depicts a conventional architecture of a photovoltaic array mounted on a vehicle, the architecture including a centralized power management system.

FIG. 1 shows a conventional architecture of a photovoltaic array mounted on a vehicle (400), the architecture including a centralized power management system. In particular, the power management system includes a photovoltaic array (310) with a plurality of array sections (311). Each array section includes a set of solar cell strings connected with an interface (320) through power distribution lines (340).

Thus, the power produced by the array section (311) is transmitted through the harness (340) or electrical bus to the interface (320). Then this power produced is transferred to the vehicle (400) by the interface (320). The bus may include discrete lines or conductors for power, ground, and control or data collection or sensor signals.

The vehicle (400) includes: a power management unit (401), a charging control unit (435), an energy storage system (430), three power interface units (415), three loads (410) and power bus (420) that connects the interface (320) to the power management unit (401) and the charging control unit (435), the energy storage system (430), the three power interface units (415) and the three loads (410) between them and the power management unit (401).

In this architecture, conventional photovoltaic arrays (310) use solar cells connected in series to achieve a desired maximum power voltage ($V_{mp}$, e.g. 30 volts DC) from the power collected at the termination of each power distribution line (340). Then, this power collected is transmitted to the vehicle (400) by the electrical harness (340) of that same voltage.

Once the power is injected into the vehicle (400) by a power bus (420), the voltage and current characteristics of the delivered power are conditioned and regulated to that needed by the loads (410) of the vehicle (400) by using a centralized power management unit (401). This power management unit (401) is located inside the vehicle (400) being connected by the power bus (420) between the first end of the interface and the loads (410), or located within a load or a power interface unit (415) itself.

Said power interface units (415) are connected in the power bus lay-out inside the vehicle previous to a load (410) in order to control the energy supplied to each load (410) in the event the power required were substantially different to the voltage conditioned by the centralized power management unit (401).

In the particular example of FIG. 1, the load (410) is the energy storage system (430), in which case its power interface unit (415) may further include the charging control unit (435).

Figure 2:
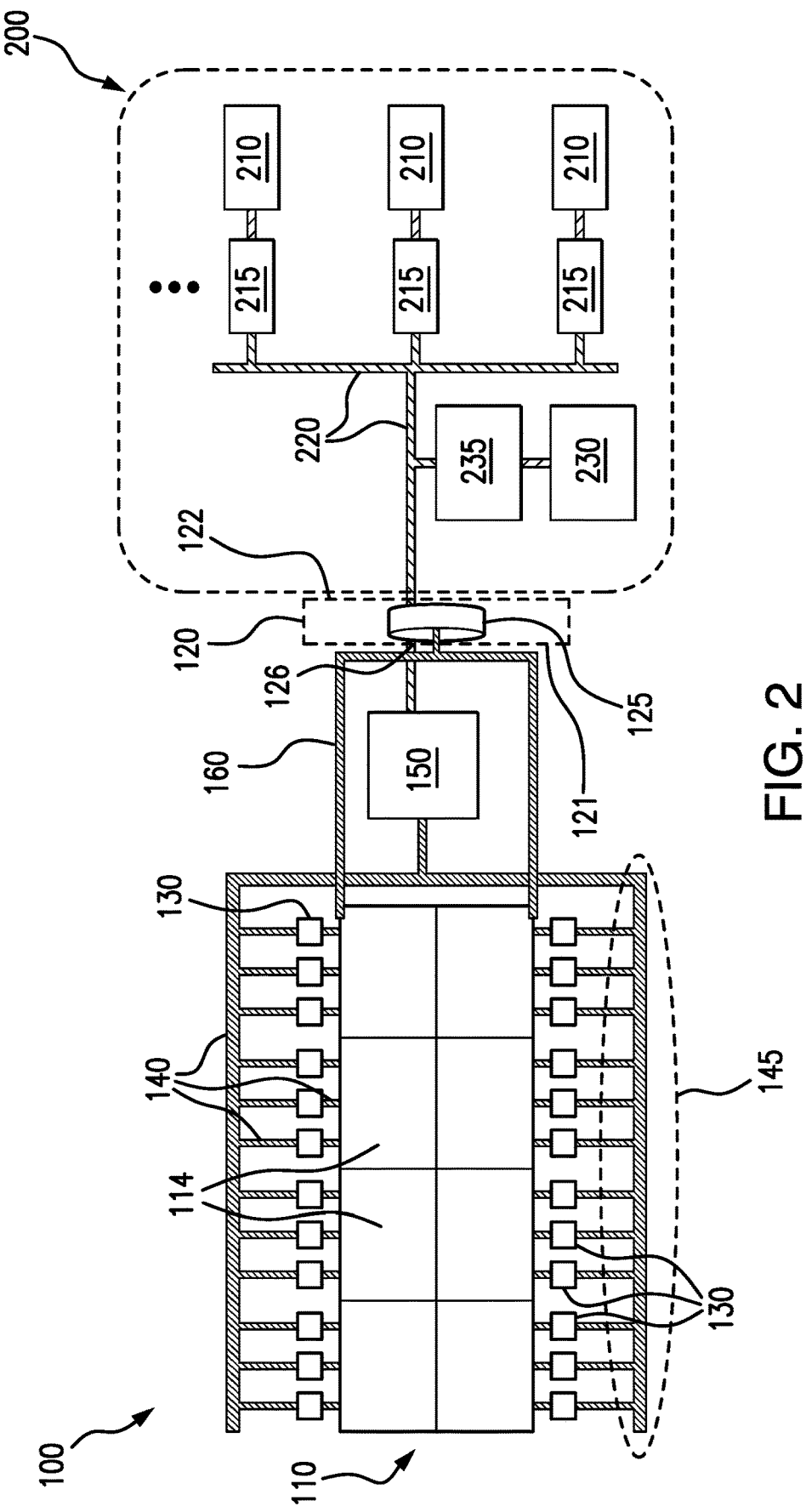
FIG. 2 depicts an embodiment of a power management system as disclosed herein mounted on a vehicle.

FIG. 2 shows a power management system (100) as disclosed herein mounted on a vehicle (200). The power management system (100) includes a photovoltaic array (110) with a plurality of array sections (111).

Figure 3:
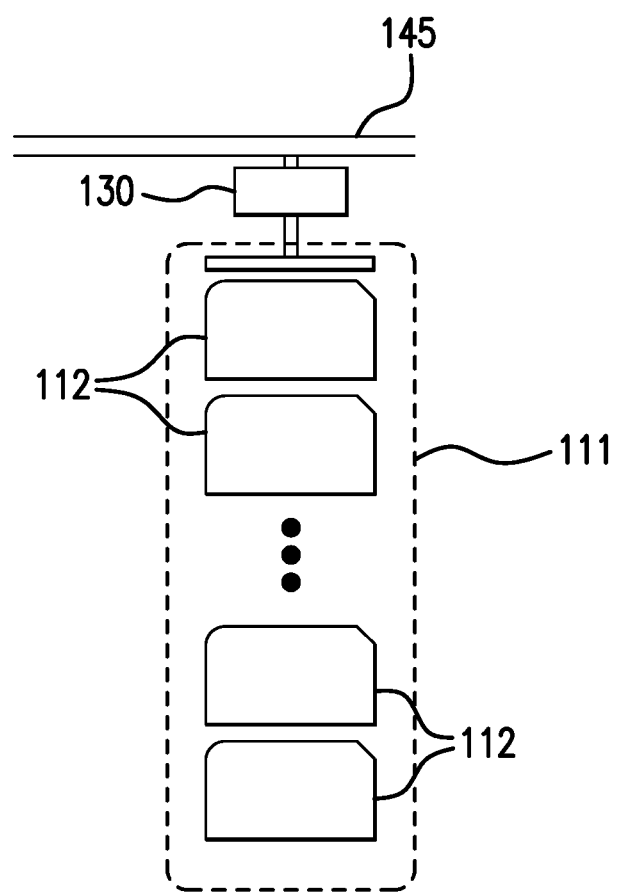
FIG. 3 depicts the basic topology of a regulator module connected to a power distribution line.

As illustrated in FIG. 2 and FIG. 3, each array section (114) includes one or more solar cell strings (111) connected to the solar array electrical power harness (145) through the power regulator units (130) using electrical wiring connections (140). Each solar cell string (112) includes the smallest entity able to collect power, i.e. the solar cells (112).

FIG. 2 further shows an interface (120) responsible for transferring the power produced by the photovoltaic array (110) to the vehicle (200). The interface (120) includes a first end (122) and a second end (121), wherein the first end (122) is electrically and mechanically connectable with a vehicle (200) and the second end (121) is electrically and mechanically connectable with the photovoltaic array (110).

The power produced from the solar radiation is output as electricity in direct current (DC) form by the solar cell string (112) through the regulators (130) via the electrical connections (140), and are joined in a common electrical connection, the so-called array harness (145).

The power management system in FIG. 2 has distributed power management modules, i.e. regulator modules (130) on each solar cell string connection line (140) and a root power management (150) near to the second end (121) of the interface (120).

Among others, the main function of such power management modules (130, 150) can include: maximum peak power tracking of the photovoltaic characteristics (I-V curve) of the solar cell string; voltage regulation, including buck or boost for selecting output DC voltage different than the solar cell string's inherent voltage range; and DC-AC conversion at any frequency for transmission onto AC power buses and use of transformers and mass and volume optimized reactive power components (e.g. capacitors and inductors).

Advantageously, disconnection of the voltage requirements of the solar cell strings (112) from the voltage requirement of the array harness (145) by the interposition of the regulator module (130) allows maximizing the power drawn from the photovoltaic array over the mission life cycle of the vehicle, and independently selection of the harness voltage and string voltage to optimum levels.

In this sense, the regulator module (130) works as a switching module for switching at power distribution line (140) level in response to changing or anomalous conditions, allowing a level of control and recovery currently unavailable to photovoltaic arrays operating in space.

The regulator modules (130) are connected by the electrical connection lines (140) and are capable of boosting the voltage at the terminal strip of that electrical connection line, collecting the power at maximum power voltage of the string ($V_{mp}$, e.g. 30 volts DC). Thus, by boosting the voltage the current provided to the electrical power harness (145) is reduced accordingly.

The power produced is output as electricity in direct current (DC) form by the electrical connection lines (140). All the electrical connection lines (140) are joined in an array harness (145) optimized for high voltage operation. The high voltage electrical harness therefore reduces current to minimize $I^2R$ power loss in the harness, while being easily insulated from the external environment to prevent any unwanted high voltage environmental interactions.

The root power management unit (150) is responsible for converting the power conditioned by the regulator modules (130) into an electric form suitable for crossing the interface (120) and also converting the DC power to high-frequency AC power for being transmitted or injected to the vehicle (200) through the interface (120).

In a situation where the power management system is assembled with the vehicle (200), the first end (122) of the interface (120) is electrically and mechanically connected with the vehicle (200) and the second end (121) of the interface (120) is electrically and mechanically connected with the photovoltaic array (110). Mechanical connections are made through a yoke structure (160).

The electrical connection is between the array harness (145), which comes from the photovoltaic array (110), and the power bus (220) that goes into the vehicle (200) for distributing the collected power to the plurality of loads (210) contained inside the vehicle (200). The power transferring function of the rotary transformer joint (126) is responsible for such electrical connection while allowing full 360 degree rotation of the orientation device (125).

The interface (120) includes an orientation driving device (125) for orienting the photovoltaic array (110) configured to minimize the angle of incidence between the incoming sunlight and a photovoltaic array (110) plane. Hence, the orientation driving device (125) structure is responsible for the mechanical connection in this embodiment through yoke structure 160.

In some embodiments, the array harness (145) and/or power bus (220) are lightweight high-frequency AC harnesses using skin effect for efficient transmission.

Contrary to the architecture or lay-out shown inside the vehicle (200) in FIG. 1, it can be seen that in the system as disclosed herein, there is no power management unit in the vehicle for centralizing the conditioning of the power collected. On the contrary, the power collected is directly distributed throughout the loads (210) as it was already conditioned into a more suitable form prior to crossing the interface (120).

The vehicle also includes power interface units (215) that control the power supplied to each load (210). As it was already mentioned, a particular example of said load (210) is the energy storage system (230); in which case, its power interface unit (215) may further include a charging control unit (235). The charging control unit (235) draws power from the power bus and coverts into a form most efficient for the energy storage battery or system (230).

In some embodiments, the vehicle (200) includes a plurality of payloads (210), and the interface (120) disposed between the vehicle (200) and the photovoltaic array (110) further includes a rotary transformer joint (126) that connects the array harness (145) to a power bus (220) located inside the vehicle (200). Said power bus (220) is configured to distribute high-frequency AC power to the plurality of payloads (210) of the vehicle (200) by a plurality of power bus lines (220).

FIG. 3 shows a schematic topology of each regulator module (130) connected to a solar cell string and the electrical power harness through electrical connection line (140) in one embodiment. As can be seen, a solar cell string (111) includes a plurality of series connected solar cells (112).

At the termination strip of the solar cell string 111, i.e. after the last solar cell connected by the electrical connection line is positioned a regulator module (130) for conditioning the power collected and transmitted by said electrical connection line (140). In some embodiments, power at the termination strip is collected at maximum power voltage ($V_{mp}$, e.g. 30 volts DC). Then, the power distribution line (140) goes through the regulator module (130) up to be connected to the array harness (145).

In addition, in this embodiment the regulator module (130) is integrated in the photovoltaic array (110) along with the power distribution line (140) for being shielded to protect the electronics thereby. In this sense, a variation of the regulator module (130) may be incorporated into the cell structure as an integrated circuit.

Optionally, a discrete regulator module (130) may be formed as part of each solar cell (112), e.g. in lieu of a bypass diode. Advantageously, a discrete regulator module can allow for withstanding of shadows, shorted solar cells, and/or opened solar cells.

Briefly, within the new architecture provided by this disclosure, the regulator module (130) is able to: sense and extract power from the termination strip at the optimum string voltage, $V_{mp}$, e.g. 30V; boost the voltage for and deliver the power distribution line (140) to the array harness (145) at the requested high voltage, e.g. 300V; and provide delivered power conditioning to eliminate voltage ripple, voltage sag, or voltage spikes.

Furthermore, the electrical connection lines (140) and the array harness (145) can include flex circuitry. Said circuitry provides an approach for readily accessing key electrical tap points, such as string and substring termination strips, diode locations, and individual solar cells.

In addition to boosting voltage while tracking maximum peak power, the regulator module (130) can also provide solar cell string (111) switching functions to change the overall power solar cell string (111) configuration so as to handle varying circumstances, such as switching out shorted strings and/or operating under different environments. In the event that the power distribution system (100) is mounted on a vehicle (200) configured for operation in space, said different environments include near sun, far sun, and earth distance.

The solar modules or panels (114) can be mounted on a support, wherein the support includes a plurality of conductive paths.

The solar cell (112) includes a first contact of a first polarity (P) connected to the first conductive path; and a second contact of a second polarity (N) connected to a second conductive path, so that the first and second conductive portions form terminals of opposite conductivity type.

In photovoltaics, bypass diodes are frequently used for each solar cell in panels (114) including a plurality of groups of solar cells. Advantageously, if one of the solar cells (112) or groups of solar cells is shaded or damaged, current produced by other solar cells, such as by unshaded or undamaged solar cells or groups of solar cells, can flow through the bypass diode and, thus, avoid the high resistance of the shaded or damaged solar cell or group of solar cells.

In addition to the bypass diodes, a string (111) may also incorporate a blocking diode that functions to prevent reverse currents during the time when the output voltage from a solar cell group is low, for example, in the absence of sun.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. The disclosed embodiments are presented for purposes of illustration and not limitation.

The invention claimed is:

1. A power management system for a space vehicle, the system comprising:
   a photovoltaic array comprising a plurality of panels, wherein each panel comprises one or more solar cell strings, each solar cell string comprising a plurality of photovoltaic cells connected in series to produce direct current (DC) power;
   at least one respective regulator module disposed on each of the one or more solar cell strings, the at least one regulator module being configured to condition the DC power produced by the one or more solar cell strings in the panel and supply it through at least one electrical connection line to an electrical power harness to route said power to a root power management unit; and
   an interface configured to transfer power produced by the photovoltaic array from the root power management unit to the space vehicle, the interface having a first end configured to be connectable with the space vehicle and a second end configured to be connectable with the photovoltaic array via the electrical power harness,
   wherein the root power management unit is operable to convert the DC power produced by the photovoltaic array in the form of DC electrical power from the electrical power harness into DC power at a different voltage, and to transfer the DC power at the different voltage to the interface.

2. A system according to claim 1, wherein at least one electrical connection line connects at least one regulator module directly to an orientation and power transfer device without root power management, wherein the orientation and power transfer device comprises slip rings that transmit DC power through a rotary joint.

3. A system according to claim 1, wherein the photovoltaic array comprises a plurality of array sections and each array section comprise sat least one string of series connected solar cells, with each array section being discrete and separated from one another.

4. A system according to claim 1, wherein the photovoltaic array comprises a plurality of panels and each panel comprises a plurality of strings of series connected solar cells, and wherein the strings of series connected solar cells are connected by a plurality of electrical connection lines being parallel distributed inside each of the panels, and each electrical connection line is connected to one regulator module.

5. A system according to claim 1, wherein each regulator module is configured to regulate the power from one or more series connected strings of solar cells for providing between 300-1000 volts DC on the array harness.

6. A system according to claim 1, wherein the root power management unit is an AC electrical power generator comprising resonance tanks, said resonance tanks being adapted to convert the DC electrical power into high frequency AC electrical power at a frequency between 1-50 kHz.

7. A system according to claim 1, wherein the interface comprises an orientation driving device for orienting the photovoltaic array, the orientation driving device comprising a rotary transformer for power transfer with integral rotation mechanism for orienting the array towards the sun.

8. A system according to claim 1, wherein the regulator module and/or the root power management unit is provided with sensors for detecting temperature, voltage, and/or current and an integrated computer configured for controlling and switching functions and commands.

9. A system according to claim 8 wherein the regulator module and/or the root power management unit further comprise protective circuitry for preventing or limiting propagation of faults by disablement of one or more strings of series connected solar cells.

10. A space vehicle comprising a space vehicle body; a power management system for a space vehicle, the system comprising:
- a photovoltaic array comprising a plurality of panels, wherein each panel comprises one or more solar cell strings, each solar cell string comprising a plurality of photovoltaic cells connected in series to produce direct current (DC) power;
- at least one regulator module disposed on each of the one or more solar cell strings, the at least one regulator module being configured to condition the DC power produced by the one or more solar cell strings in the panel and supply it through at least one electrical connection line to an electrical power harness to route said power to a root power management unit; and
- an interface configured to transfer power produced by the photovoltaic array from the root power management unit to the space vehicle, the interface having a first end configured to be connectable with the space vehicle and a second end configured to be connectable with the photovoltaic array via the electrical power harness,
- wherein the root power management unit is operable to convert the DC power produced by the photovoltaic array in the form of DC electrical power from the electrical power harness into DC power at a different voltage, and to transfer the DC power at the different voltage to the interface.

11. A space vehicle according to claim 10, wherein the vehicle comprises a plurality of payloads, and wherein the interface disposed between the vehicle and the photovoltaic array further comprises a rotatory transformer joint that connects the electrical power harness to a power bus located inside the vehicle, and wherein said power bus is configured to distribute high-frequency AC power to the plurality of payloads of the vehicle by a plurality of power bus lines.

12. A space vehicle according to claim 11, wherein one of the plurality of payloads of the vehicle is an energy storage system adapted to store energy.

13. A space vehicle according to claim 12 wherein the power bus line that distributes power to the energy storage system comprises a charging control unit configured to monitor the level of charge of the energy storage system and to regulate the energy supplied to the said energy storage system.

14. A space vehicle according to claim 10, wherein each power bus line that distributes the energy to the loads comprises a power interface unit to control and condition the power supplied from the power bus line to each payload.

15. A space vehicle according to claim 13, wherein the charging control unit and/or the power interface unit is further provided with protective circuitry for preventing or limiting the propagation of faults by disablement of an electrical section.

16. A power management system according to claim 1 wherein the root power management unit is connected to the second end of the interface by at least one electrical power harness, the root power management unit being configured to convert the DC power produced by the photovoltaic array in the form of DC electrical power from the electrical power harness into high frequency alternating current (AC) power, and to transfer the high frequency AC power to the interface through the second end.

* * * * *